(12) United States Patent
Moon et al.

(10) Patent No.: US 8,723,210 B2
(45) Date of Patent: May 13, 2014

(54) LIGHT EMITTING DEVICE AND LIGHT EMITTING DEVICE PACKAGE HAVING THE SAME

(71) Applicant: LG Innotek Co., Ltd., Seoul (KR)

(72) Inventors: Ji Hyung Moon, Seoul (KR); Hwan Hee Jeong, Seoul (KR); Sang Youl Lee, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/054,335

(22) Filed: Oct. 15, 2013

(65) Prior Publication Data

US 2014/0042480 A1 Feb. 13, 2014

Related U.S. Application Data

(63) Continuation of application No. 13/528,453, filed on Jun. 20, 2012, now Pat. No. 8,581,277, which is a continuation of application No. 13/024,883, filed on Feb. 10, 2011, now Pat. No. 8,354,664.

(30) Foreign Application Priority Data

Feb. 11, 2010 (KR) .................. 10-2010-0012758

(51) Int. Cl.
*H01L 33/00* (2010.01)
(52) U.S. Cl.
USPC .............................. 257/98; 257/94
(58) Field of Classification Search
USPC .................................................. 257/98, 94
See application file for complete search history.

(56) References Cited

U.S. PATENT DOCUMENTS

| 7,372,078 B2 | 5/2008 | Jang et al. |
| 7,989,820 B2 | 8/2011 | Lee |
| 2005/0281303 A1 | 12/2005 | Horio et al. |
| 2006/0270075 A1 | 11/2006 | Leem |
| 2007/0025231 A1 | 2/2007 | Ochiai et al. |
| 2008/0121923 A1 | 5/2008 | Harle et al. |
| 2009/0294784 A1 | 12/2009 | Nakahara et al. |
| 2010/0155693 A1 | 6/2010 | Seo |
| 2010/0264442 A1 | 10/2010 | Lee |
| 2010/0308358 A1 | 12/2010 | Bae et al. |
| 2011/0062480 A1 | 3/2011 | Lim |

FOREIGN PATENT DOCUMENTS

| CN | 1929218 A | 3/2007 |
| EP | 1727218 A2 | 11/2006 |
| EP | 2 262 011 A2 | 12/2010 |
| EP | 2262014 A2 | 12/2010 |
| KR | 10-2009-0104931 A | 10/2009 |
| KR | 10-2009-0119259 A | 11/2009 |
| KR | 10-0962900 A | 6/2010 |
| WO | 2009/002040 A2 | 12/2008 |
| WO | 2009/139603 A2 | 11/2009 |

*Primary Examiner* — Douglas Menz
(74) *Attorney, Agent, or Firm* — Birch, Stewart, Kolasch & Birch, LLP

(57) ABSTRACT

Disclosed are a light emitting device. The light emitting device includes a light emitting structure including a first and second conductive semiconductors, and an active layer; an insulating layer on a lateral surface of the light emitting structure; an electrode on the first conductive semiconductor layer; an electrode layer under the second conductive semiconductor layer; and a protective layer including a first portion between the light emitting structure and the electrode layer and a second portion extending outward beyond a lower surface of the light emitting structure, wherein the first conductive semiconductor layer includes a first top surface including a roughness on a first region, and a second top surface lower than the first region and being closer the lateral surface of the light emitting structure than the first region, wherein the second top surface is disposed on an edge portion of the first conductive semiconductor layer.

20 Claims, 10 Drawing Sheets

LIGHT EMITTING DEVICE AND LIGHT EMITTING DEVICE PACKAGE HAVING THE SAME

This application is a Continuation of co-pending U.S. patent application Ser. No. 13/528,453 filed on Jun. 20, 2012, which is a continuation of U.S. patent application Ser. No. 13/024,883 filed on Feb. 10, 2011, now U.S. Pat. No. 8,354,664, which claims priority under 35 U.S.C. 119 to Korean Patent Application No. 10-2010-0012758 filed on Feb. 11, 2010.

BACKGROUND

The embodiment relates to a light emitting device and a light emitting device package having the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device and a light emitting package, capable of preventing a compound semiconductor layer from being damaged according to a substrate separating process.

The embodiment provides a light emitting device and a light emitting device package having the same, in which a first conductive type semiconductor layer has a stepped structure.

According to the embodiment, the light emitting device includes a light emitting structure including a first conductive type semiconductor layer, a second conductive type semiconductor layer, and an active layer between the first conductive type semiconductor layer and the second conductive type semiconductor layer, wherein the first conductive type semiconductor layer includes a stepped structure having a second top surface stepped lower than the first top surface thereof; an insulating layer disposed on a lateral surface of the light emitting structure and the second top surface of the first conductive type semiconductor layer; an electrode electrically connected with the first conductive type semiconductor layer; an electrode layer under the second conductive type semiconductor layer; and a protective layer disposed on a periphery portion of a lower surface of the second conductive type semiconductor layer.

According to the embodiment, the light emitting device includes a light emitting structure including a first conductive type semiconductor layer having a stepped structure, a second conductive type semiconductor layer, and an active layer between the first conductive type semiconductor layer and the second conductive type semiconductor layer; an insulating layer disposed on peripheral portion of the light emitting structure; an electrode electrically connected with the first conductive type semiconductor layer; an electrode layer including an ohmic layer under the second conductive type semiconductor layer; and a protective layer formed around a lower surface of the second conductive type semiconductor layer, wherein the stepped structure of the first conductive type semiconductor layer includes a first recess portion between a first lateral surface and the electrode, a second recess portion between a second lateral surface and the electrode, and a third recess portion connected to the first recess portion and the second recess portion.

According to the embodiment, a method of manufacturing the light emitting device, the method comprising: forming an absorption layer at a peripheral portion of a top surface of a substrate, wherein the absorption layer includes a material having a band gap energy lower than that of the substrate; forming a light emitting structure including a first conductive type semiconductor layer, an active layer, and a second conductive type semiconductor layer on a first substrate and the absorption layer; forming a protective layer at an outer peripheral portion of a top surface of the light emitting structure; forming an electrode layer on the light emitting structure; forming a conductive support member on the electrode layer; removing the substrate from the light emitting structure; removing the absorption layer; and forming an electrode on the first conductive type semiconductor layer.

According to the embodiment, a light emitting device package includes a body, a plurality of lead electrodes on the body, a light emitting device provided on at least one of the lead electrodes, and electrically connected with the lead electrodes, and a molding member on the light emitting device. The light emitting device includes a light emitting structure including a first conductive type semiconductor layer, a second conductive type semiconductor layer, and an active layer between the first conductive type semiconductor layer and the second conductive type semiconductor layer, wherein the first conductive type semiconductor layer includes a stepped structure having a second top surface stepped lower than the first top surface thereof; an insulating layer disposed on a lateral surface of the light emitting structure and the second top surface of the first conductive type semiconductor layer; an electrode electrically connected with the first conductive type semiconductor layer; an electrode layer under the second conductive type semiconductor layer; and a protective layer disposed on a periphery portion of a lower surface of the second conductive type semiconductor layer.

DETAILED DESCRIPTION OF THE EMBODIMENTS

Figure 1:
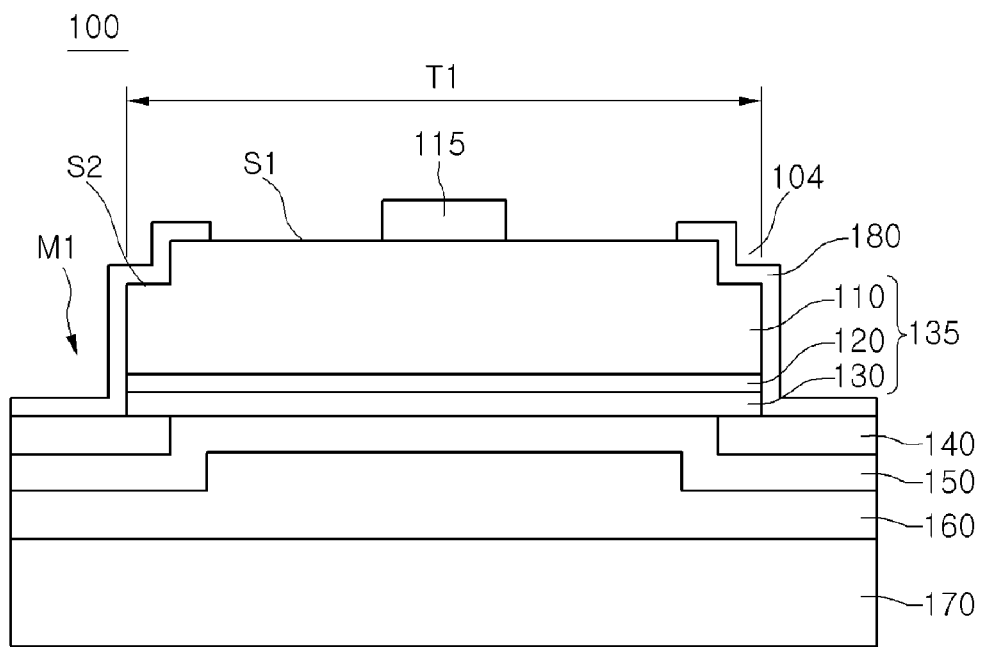
FIG. 1 is a side sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiments will be described with reference to the accompanying drawings. The thickness and size of each layer shown in the drawings may be exaggerated, omitted or schematically drawn for the purpose of convenience or clarity. In addition, the size of elements does not utterly reflect an actual size.

Figure 2:
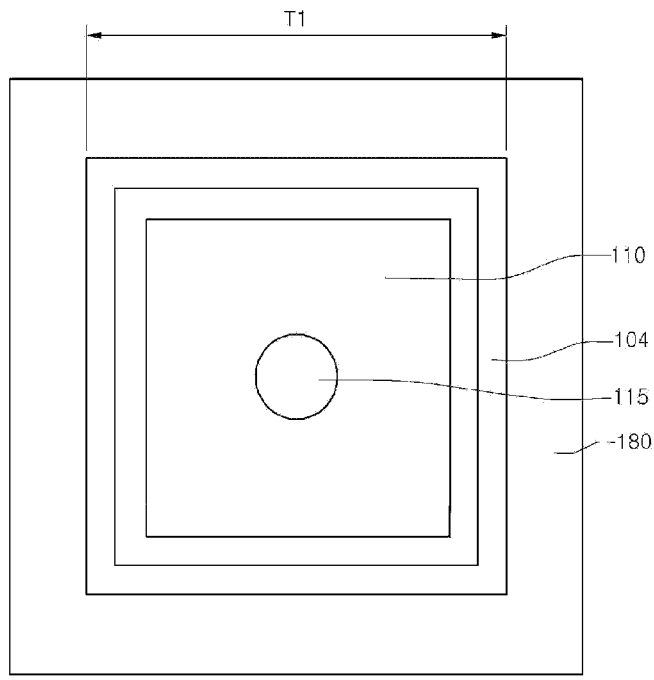
FIG. 2 is a plan view of FIG. 1.

FIG. 1 is a side sectional view showing a light emitting device 100 according to a first embodiment, and FIG. 2 is a plan view of FIG. 1.

Referring to FIGS. 1 and 2, the light emitting device 100 includes an electrode 115, a light emitting structure 135 having a plurality of compound semiconductor layers 110, 120, and 130, a protective layer 140, an electrode layer 150, an adhesion layer 160, a conductive support member 170, and an insulating layer 180.

The light emitting device 100 may include compound semiconductors such as light emitting diodes (LEDs) including compound semiconductors of group III-V elements. The groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$). The LEDs may be visible-ray band LEDs to emit blue, green, red light or UV LEDs, but the embodiment is not limited thereto.

The light emitting structure 135 includes the first conductive type semiconductor layer 110, the active layer 120, and the second conductive type semiconductor layer 130 that include compound semiconductors of group III-V elements.

The first conductive type semiconductor layer 110 may include one selected from the group consisting of GaN, AlN, AlGaN, InGaN, InN, InAlGaN, AlInN, AlGaAs, GaP, GaAs, GaAsP, AlGaInP, which are compound semiconductors of III-V group elements doped with a first conductive dopant. When the first conductive type semiconductor layer 110 is an N type semiconductor layer, the first conductive dopant includes an N type dopant such as Si, Ge, Sn, Se or Te. The first conductive type semiconductor layer 110 may have a single layer or a multilayer, but the embodiment is not limited thereto. The first conductive type semiconductor layer 110 is provided on a top surface thereof with roughness and/or a pattern, but the embodiment is not limited thereto.

Referring to FIGS. 1 and 2, the first conductive type semiconductor layer 110 is provided at edges thereof with a stepped structure 104, and the stepped structure 104 includes a second top surface S2 stepped lower than the first top surface 51 of the first conductive type semiconductor layer 110. The stepped structure 104 is formed along the edges of the first conductive type semiconductor layer 110. The stepped structure 104 has a first recess portion between a first lateral surface of the first conductive type semiconductor layer 110 and the electrode 115, a second recess portion between a second lateral surface of the first conductive type semiconductor layer 110 and the electrode 115, and plurality of third recess portions connected to the first recess portion and the second recess portion. For example, when viewed in a plan view, the stepped structure 104 may have a loop shape such as ring shape, a frame shape, or a strip shape. The stepped structure 104 may have a polygonal shape such as a rectangle or may have a hemispherical side section.

The stepped structure 104 may have at least two open sides. The second top surface S2 of the stepped structure 104 may be lower than the first top surface S1 of the first conductive type semiconductor layer 110. The depth of the stepped structure 104 may be thinner than the thickness of the first conductive type semiconductor layer 110.

The light emitting device 100 is provided at an outer portion thereof with the insulating layer 180, and the insulating layer 180 extends to the top surface S2 of the first conductive type semiconductor layer 110.

The insulating layer 180 is formed in the stepped structure 104. That is, the insulating layer 180 may be formed in a stepped structure at the stepped structure 104. Since the stepped structure 104 includes the second top surface S2 of the first conductive type semiconductor layer 110 and a lateral surface between the first top surface S1 and the second top surface S2, light can be emitted through the surface of the stepped structure 104. This can improve light extraction efficiency and the distribution of optical orientation angles An interval T1 between the stepped structures 104 on the first conductive type semiconductor layer 110 is an interval between the second top surface S2 provided at one side of the first conductive type semiconductor layer 110 and the second top surface S2 provided at an opposite side of the first conductive type semiconductor layer 110. The interval T1 may correspond to an interval between laser shots, substantially, the size of one laser shot. The first conductive type semiconductor layer 110 may include an upper layer having a first width and a lower layer having a second width narrower than the first width.

In the stepped structure 104, the width of the second top surface S2 may be greater than a width of an overlap region of edges of adjacent laser shots. In this case, a laser beam is irradiated into a growth substrate of a semiconductor layer. In detail, the laser beam may be irradiated into the growth substrate with the size of a shot having a predetermined area. According to the size of the shot, the interval between the stepped structures 104 or the width of the stepped structure 104 may be changed.

The first conductive type semiconductor layer 110 may be provided thereon with the electrode 115. The electrode 115 may be a pad or an electrode having a branch or arm structure connected to the pad, but the embodiment is not limited thereto.

The electrode 115 makes ohmic contact with the top surface of the first conductive type semiconductor layer 110. The electrode 115 may include one of Cr, Ti, Al, In, Ta, Pd, Co, Ni, Si, Ge, Ag, Cu and Au or the mixture of plural materials in a single layer or in a multiple layer. The electrode 115 may be formed in consideration of an ohmic property with the first conductive type semiconductor layer 110, an adhesion property between metallic layers, a reflective property, and conductivity.

The active layer 120 is provided under the first conductive type semiconductor layer 110. The active layer 120 may have a single quantum well structure, a multiple quantum well structure, a quantum wire structure, or a quantum dot structure. The active layer 120 may have a stack structure including a well layer and a barrier layer, which are made from compound semiconductors of group III-V elements. For example, the active layer 120 may have a stack structure of an InGaN well layer/GaN barrier layer, an InGaN well layer/AlGaN barrier layer, or an InGaN well layer/InGaN layer. The band gap of the barrier layer may be higher than the band gap of the well layer.

A conductive clad layer may be formed on and/or under the active layer 120. The conductive clad layer may include a nitride-based semiconductor. The band gap of the conductive clad layer may be higher than the band gap of the barrier layer.

The second conductive type semiconductor layer 130 is disposed under the active layer 120. The second conductive type semiconductor layer 130 includes the compound semiconductors of group III-V elements doped with the second conductive dopant. For instance, the second conductive type semiconductor layer 130 may include at least one selected from the group consisting of GaN, AlN, AlGaN, InGaN, InN, InAlGaN, AlInN, AlGaAs, GaP, GaAs, GaAsP, and AlGaInP. If the second conductive type semiconductor layer is a P type semiconductor layer, the second conductive dopant includes the P type dopant such as Mg or Ze. The second conductive type semiconductor layer 130 can be prepared as a single layer or a multiple layer, but the embodiment is not limited thereto.

The light emitting structure 135 may further include a third conductive type semiconductor layer under the second conductive type semiconductor layer 130. The third conductive type semiconductor layer may have polarities opposite to those of the second conductive type semiconductor layer 130. The first conductive type semiconductor layer 110 may include a P-type semiconductor layer, and the second conductive type semiconductor layer 130 may include an N-type semiconductor. Accordingly, the light emitting structure 135 may include at least one of an N-P junction structure, a P-N junction structure, an N-P-N junction structure, and a P-N-P junction structure.

The protective layer 140 and the electrode layer 150 are formed under the second conductive type semiconductor layer 130 or the third conductive type semiconductor layer. Hereinafter, for the purpose of explanation, the second conductive type semiconductor layer 130 will serve as the lowest layer of the light emitting structure 135.

The electrode layer 150 is provided at an inner portion of a lower surface of the second conductive type semiconductor layer 130, and the protective layer 140 is provided at a peripheral portion of the lower surface of the second conductive type semiconductor layer 130. The protective layer 140 is defined as a channel layer of the light emitting device.

The protective layer 140 may be exposed at a channel region M1 outside of a chip, or may be provided under the insulating layer 180. The channel region M1 in which the protective layer 140 is provided corresponds to a boundary region of chips, that is, a peripheral region of a device. An inner portion of a top surface of the protective layer 140 makes contact with the lower surface of the second conductive type semiconductor layer 130 with a predetermined width (e.g., width of a few micrometers (μm) or a few tens micrometers (μm). The width varies depending on a chip size. The protective layer 140 may have a thickness of about 0.02 μm to about 5 μm, and the thickness may vary depending on the chip size.

Referring to FIGS. 1 and 2, the protective layer 140 may be formed around the lower surface of the second conductive type semiconductor layer 130. When viewed in a plan view of a device, the protective layer 140 may have a loop-shape pattern, a ring-shape pattern, or a frame-shape pattern. The protective layer 140 may have a continuous pattern or a discontinuous pattern.

The protective layer 140 may include a material (e.g., a transmissive oxide, a transmissive nitride, or a transmissive insulating material) having a refractive index lower than that of compound semiconductors of group III-V elements. The protective layer 140 may include one selected from the group consisting of indium tin oxide (ITO), indium zinc oxide (IZO), indium zinc tin oxide (IZTO), indium aluminum zinc oxide (IAZO), indium gallium zinc oxide(IGZO), indium gallium tin oxide (IGTO), aluminum zinc oxide (AZO), antimony tin oxide (ATO), gallium zinc oxide(GZO), $SiO_2$, $SiO_x$, $SiO_xN_y$, $Si_3N_4$, $Al_2O_3$, and $TiO_2$.

The protective layer 140 can prevent the light emitting structure 135 from being shorted even if the outer wall of the light emitting structure is exposed to moisture, thereby enabling the LED to have superior property under the high moisture condition. If the protective layer 140 includes a transmissive material, when the laser scribing process is performed, the laser beam passes through the protective layer 140 so that metallic particles caused by the laser beam may not be generated from the channel region M1, thereby preventing interlayer short from occurring at the sidewall of the light emitting structure.

The protective layer 140 spaces the outer wall of each layer 110, 120, or 130 of the light emitting structure 135 apart from the electrode layer 150.

The electrode layer 150 may be provided under the second conductive type semiconductor layer 130, and may include at least one of an ohmic layer, an electrode layer, and adhesion layer. The electrode layer 150 may have a single layer structure or a multiple-layer structure. The ohmic layer may be prepared in the form of a layer or a plurality of patterns. The ohmic layer may include at least one of a metallic material or an oxide material. For example, the ohmic layer may include at least one selected from the group consisting of ITO, IZO, IZTO, IAZO, IGZO, IGTO, AZO, ATO, GZO, IrOx, RuOx, RuOx/ITO, Ni/IrOx/Au, Ni/IrOx/Au/ITO, Pt, Ni, Au, Rh, and Pd. The reflective layer may be prepared in the structure of at least one layer including Ag, Ni, Al, Rh, Pd, Ir, Ru, Mg, Zn, Pt, Au, Hf, and alloy thereof. The electrode layer 150 may include seed metal, and the seed metal is used for a plating process. Accordingly, the electrode layer 150 may selectively an ohmic layer, a seed layer, or an electrode layer, but the embodiment is not limited thereto.

The electrode layer 150 may cover an entire portion of a lower surface of the protective layer 140, or 80% or less of a width of the lower surface of the protective layer 140.

Since the width of the electrode layer 150 is greater than the width of the light emitting structure 135, the reflection efficiency of light incident onto the electrode layer 150 can be improved. Accordingly, the light extraction efficiency can be improved.

The electrode layer 150 may make contact with a portion or an entire portion of the protective layer 140 under the protective layer 140, but the embodiment is not limited thereto.

The adhesion layer 160 may be provided under the electrode layer 150, and may make contact with the lower surface of the protective layer 140 according to the structure of the electrode layer 150, but the embodiment is not limited thereto. The adhesion layer 160 may include barrier metal or bonding metal. For example, the adhesion layer 160 may include at least one selected from the group consisting of Ti, Au, Sn, Ni, Cr, Ga, In, Bi, Cu, Ag and Ta.

The adhesion layer 160 may serve as a bonding layer, and is bonded with the conductive support member 170 provided under the adhesion layer 160. The conductive support member 170 can be plated on the electrode layer 150 or attached to the electrode layer 150 in the form of a sheet without using the adhesion layer 160.

The adhesion layer 160 is provided under with the conductive support member 170, and the conductive support member 170 serves as a base substrate. The conductive support member 170 may include copper (Cu), gold (Au), nickel (Ni), molybdenum (Mo), copper-tungsten (Cu—W), or a carrier wafer such as Si, Ge, GaAs, ZnO, SiC, SiGe, or GaN. The conductive support member 170 may not be formed, or may include a conductive sheet.

The insulating layer 180 may be formed at the outer portion of the light emitting structure 135. In detail, the insulating layer 180 may be formed on the top surface of the first conductive type semiconductor layer 110 and at a later surface of each layer 110, 120, or 130 of the light emitting structure 135. The insulating layer 180 may extend to the top surface of the protective layer 140. The insulating layer 140 may include a material, such as $SiO_2$, $SiO_x$, $SiO_xN_y$, $Si_3N_4$, $Al_2O_3$, or $TiO_2$, having a refractive index lower than a refractive index (GaN: about 2.4) of the compound semiconductor.

FIGS. 3 to 13 are sectional views showing a method of manufacturing the light emitting device of FIG. 1.

Figure 3:
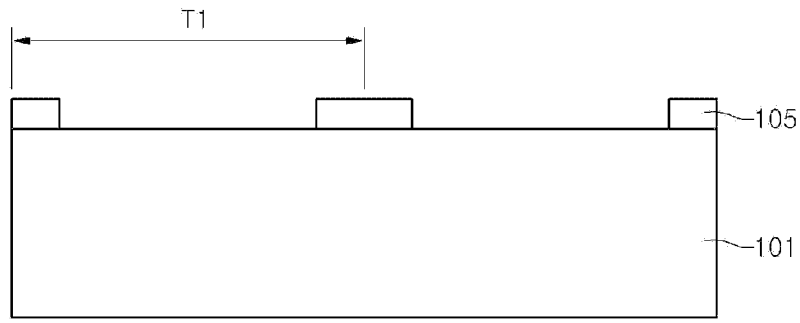
FIGS. 3 to 13 are sectional views showing the light emitting device of FIG. 1.
Figure 4:
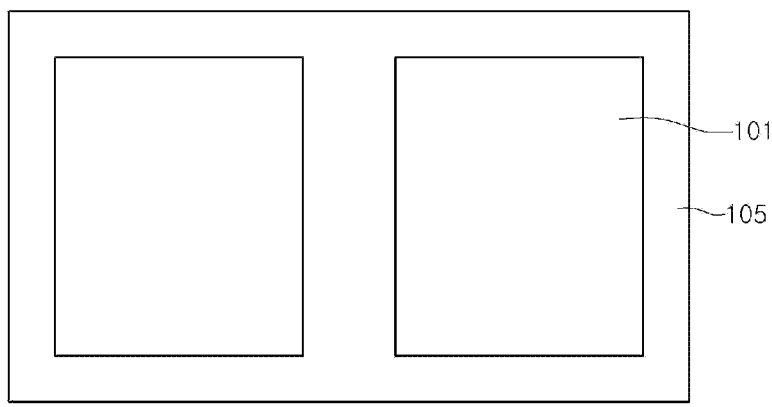

Referring to FIGS. 3 and 4, a substrate 101 is loaded into growth equipment and compound semiconductors of group II to VI elements are formed on the substrate 101 in the form of a layer or a pattern.

The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment.

The substrate 101 may include one selected from the group consisting of $Al_2O_3$, GaN, SiC, ZnO, Si, GaP, InP, $Ga_2O_3$, conductive material and GaAs. A concave-convex pattern can be formed on the top surface of the substrate 101.

An absorption layer 105 may be formed at a peripheral portion of a top surface of the substrate 101. The absorption layer 105 may be formed through a sputtering or deposition scheme using a mask pattern. The above process may be changed in the technical scope of the embodiment. The absorption layer 105 has a thickness of about 100 to about 30000 or more. The absorption layer 105 may have a thickness less than a thickness of a GaN thin film, for example, the thickness of the first conductive type semiconductor layer 110. The absorption layer 105 may have a width of about 10 μm to about 30 μm.

The absorption layer 105 includes a material enduring at an epitaxial growth temperature. In addition, since the absorption layer 105 may include a material having a band gap energy lower than energy of a laser wavelength used when the substrate 101 is removed, the absorption layer 105 may include absorb light having the laser wavelength.

In addition, the absorption layer 105 includes a material having a thermal expansion coefficient lower than those of the substrate 101 and a compound semiconductor (e.g., GaN), thereby mitigating stress caused by the difference of the thermal expansion coefficient when the compound semiconductor is grown. When the absorption layer 105 includes ZnO, the substrate 101 includes sapphire, and the nitride semiconductor includes GaN, the thermal expansion coefficient of the ZnO is about $2.9 \times 10^{-6}$/K, the thermal expansion coefficient of the sapphire is about $7 \times 10^{-6}$/K, and the thermal expansion coefficient of the GaN is about $5.6 \times 10^{-6}$/K, but the embodiment is not limited to the above numeric values of the thermal expansion coefficients.

The absorption layer 105 may include a metallic oxide or a metallic nitride. The absorption layer 105 may have a single layer structure or a multiple layer structure including ZnO, WO, and MoO.

The ZnO, WO, or MoO endure a high temperature (i.e., epitaxial growth temperature), and may have a band gap of about 3.3 eV. When the substrate 101 includes sapphire, the band gap of the substrate 101 is about 9.9 eV, and the band gap of GaN is about 4 eV to about 5 eV. The absorption layer 105 may include a material of $TiO_2$, $SiO_2$, $Si_3N_4$, TiN, AlN, GaN, W, or Mo, but the embodiment is not limited thereto.

The absorption layer 105 may be formed at one shot interval T1 of a laser beam. When viewed in a plan view, the absorption layer 105 may have a continuous structure in at least one of a ring shape, a strip shape, and a frame shape. The absorption layer 105 may have a width greater than that of an overlap area of one laser shot and a next laser shot.

Figure 5:
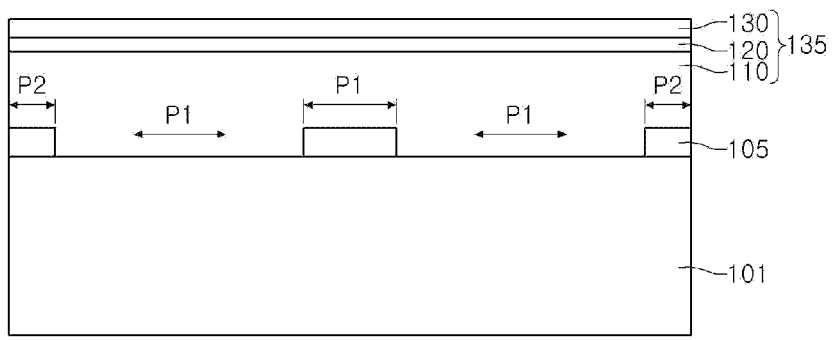

Referring to FIG. 5, the substrate 101 is provided thereon with a layer or a pattern including compound semiconductors of group II to VI elements. For example, the substrate 101 may include at least one of a ZnO layer (not shown), a buffer layer (not shown), and an undoped semiconductor layer (not shown).

The buffer layer and the undoped semiconductor layer may include a compound semiconductor of group III-V elements. The buffer layer reduces a lattice constant difference from the substrate 101, and the undoped semiconductor layer may include an undoped GaN-based semiconductor layer. Hereinafter, a structure in which the first conductive type semiconductor layer 110 is formed on the substrate 101 will be described as one example for the purpose of explanation.

The first conductive type semiconductor layer 110 is formed on the substrate 101, and the active layer 120 is formed on the first conductive type semiconductor layer 110. The second conductive type semiconductor layer 130 is formed on the active layer 120.

The first conductive type semiconductor layer 110 may include one selected from the group consisting of GaN, AlN, AlGaN, InGaN, InN, InAlGaN, AlInN, AlGaAs, GaP, GaAs, GaAsP, and AlGaInP, which are compound semiconductors of III-V group elements doped with a first conductive dopant. When the first conductive type semiconductor layer 110 is an N type semiconductor layer, the first conductive dopant includes an N type dopant such as Si, Ge, Sn, Se or Te. The first conductive type semiconductor layer 110 may have a single layer or a multilayer, but the embodiment is not limited thereto.

The first conductive type semiconductor layer 110 may be formed on the substrate 101 and the absorption layer 105. When the first conductive type semiconductor layer 110 is grown from the absorption layer 105, the first conductive type semiconductor layer 110 may seal the absorption layer 105. For example, the first conductive type semiconductor layer 110 may be grown in the form of a flat top surface by adjusting pressure, a temperature, and gas flow rate, but the embodiment is not limited thereto.

In this case, first stress P1 is generated from an interfacial surface between the first conductive type semiconductor layer 110 and the substrate 101 due to the difference in a thermal expansion coefficient between the two materials, and a second stress P2 is generated from an interfacial surface between the first conductive type semiconductor layer 110 and the absorption layer 105 due to the difference in a thermal expansion coefficient between the two materials. Accordingly, the first conductive type semiconductor layer 110 reacts with an adjacent material such that the first stress P1 is offset from the second stress P2. Accordingly, stress caused by the thermal expansion coefficient difference from an adjacent material can be reduced.

The substrate 101 may include sapphire having a thermal expansion coefficient greater than that of a group III-V compound semiconductor (e.g., GaN). The absorption layers 105 may be spaced apart from each other at a preset interval by using ZnO. The ZnO has a thermal expansion coefficient of about $2.9 \times 10^{-6}$/K, the sapphire has a thermal expansion coefficient of about $7 \times 10^{-6}$/K, and the GaN has a thermal expansion coefficient of about $5.6 \times 10^{-6}$/K, but the above thermal expansion coefficients may have various values.

Since the stress between the substrate 101 and a compound semiconductor such as the first conductive type semiconductor layer 110 is offset from the stress between the absorption layer 105 and the first conductive type semiconductor layer 110, the first conductive type semiconductor layer 110 can prevent the substrate 101 from being bent due to the thermal expansion difference, prevent potential defects, or significantly reduce cracks. In addition, a crack-free nitride semiconductor thin film can be grown.

The active layer 120 is formed on the first conductive type semiconductor layer 110. The active layer 120 may have a single quantum well structure, a multiple quantum well structure, a quantum wire structure, or a quantum dot structure. The active layer 120 may have a stack structure including a well layer and a barrier layer, which are made from compound semiconductors of group III-V elements. For example, the active layer 120 may have a stack structure of an InGaN well layer/GaN barrier layer, an InGaN well layer/AlGaN barrier layer, or an InGaN well layer/InGaN barrier layer, but the embodiment is not limited thereto. The band gap of the barrier layer may be higher than the band gap of the well layer.

A conductive clad layer may be formed on and/or under the active layer 120. The conductive clad layer may include a nitride-based semiconductor. The conductive clad layer may have band gap higher than that of the barrier layer.

The second conductive type semiconductor layer 130 is formed on the active layer 120. The second conductive type semiconductor layer 130 includes the group III-V compound semiconductor doped with the second conductive dopant. For instance, the second conductive type semiconductor layer 130 may include at least one selected from the group consisting of GaN, AlN, AlGaN, InGaN, InN, InAlGaN, AlInN, AlGaAs, GaP, GaAs, GaAsP, and AlGaInP. If the second conductive type semiconductor layer is a P type semiconductor layer, the second conductive dopant includes the P type dopant such as Mg or Ze. The second conductive type semiconductor layer 130 can be prepared as a single layer or a multiple layer, but the embodiment is not limited thereto.

The first conductive type semiconductor layer 110, the active layer 120, and the second conductive type semiconductor layer 130 may be defined as the light emitting structure 135. In addition, the second conductive type semiconductor layer 130 is provided thereon with the third conductive type semiconductor, for example, an N-type semiconductor having polarities opposite to those of a second conductive type. Thus, the light emitting structure 135 may include at least one of an N-P junction structure, a P-N junction structure, an N-P-N junction structure, and a P-N-P junction structure.

Figure 6:
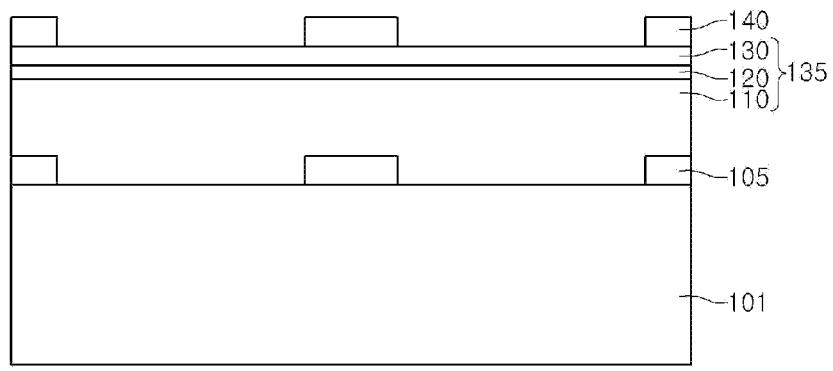

Referring to FIGS. 5 and 6, the protective layer 140 is formed on the second conductive type semiconductor layer 130, and formed at a channel region corresponding to an individual chip boundary. The protective layer 140 is formed around the individual chip region by using a mask pattern. The protective layer 140 may have a continuous pattern or a discontiuous pattern having a ring shape, a band shape, or a frame shape. The protective layer 140 may include a material (e.g., an oxide, a nitride, or a insulating material) having a refractive index lower than that of compound semiconductors of group III-V elements. The protective layer 140 may include one selected from the group consisting of ITO, IZO, IZTO, IAZO, IGZO, IGTO, AZO, ATO, GZO, $SiO_2$, $SiO_x$, $SiO_xN_y$, $Si_3N_4$, $Al_2O_3$, and $TiO_2$. The protective layer 140 is patterned by using a mask through a lithography process. The protective layer 140 may be formed through a sputtering scheme or a deposition scheme using the above materials. If the protective layer 140 is a conductive oxide, the protective layer 140 may serve as a current diffusion layer or a current injection layer.

Figure 7:
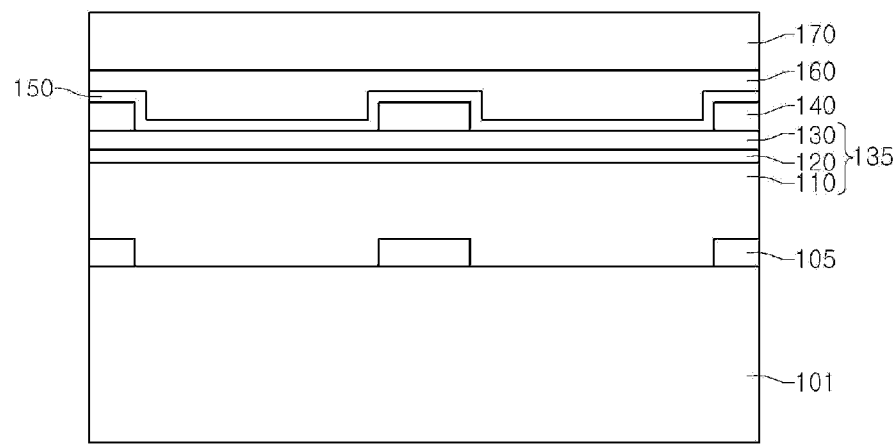

Referring to FIGS. 6 and 7, the electrode layer 150 is formed on the second conductive type semiconductor layer 130. The electrode layer 150 makes contact with the top surface of the second conductive type semiconductor layer 130. The electrode layer 150 is formed on the second conductive type semiconductor layer 130 to reduce contact resistance.

The electrode layer 150 may include at least one of an ohmic layer, a reflective layer, and adhesion layer. The ohmic layer may be prepared in the form of a layer or a plurality of patterns. The ohmic layer may include at least one of a metallic material and an oxide material. The ohmic layer may include at least one selected from the group consisting of ITO, IZO, IZTO, IAZO, IGZO, IGTO, AZO, ATO, GZO, IrOx, RuOx, RuOx/ITO, Ni/IrOx/Au, Ni/IrOx/Au/ITO, Pt, Ni, Au, Rh, and Pd. The reflective layer may be prepared in the structure of at least one layer including Ag, Ni, Al, Rh, Pd, Ir, Ru, Mg, Zn, Pt, Au, Hf, and alloy thereof. The electrode layer 150 may be deposited through an electron beam (E-beam) scheme or may be formed through a sputtering scheme or a plating scheme, but the embodiment is not limited.

The electrode layer 150 may have a stack structure of a first adhesion layer/electrode layer/second adhesion layer/seed layer. The first and second adhesion layers include Ni, the electrode layer includes Ag, and the seed layer includes Cu. The first adhesion layer has a thickness of a few nanometers (nm) or less, and the electrode layer has a thickness of a few hundreds nanometers (nm). The second adhesion layer may have a thickness of a few tens nanometers (nm), and the seed layer may have a thickness of about 1 μm or less, but the embodiment is not limited thereto.

The electrode layer 150 may completely cover the whole area of the protective layer 140 or partially cover the protective layer 140. Since the electrode layer 150 includes reflective metal, the electrode layer 150 may serve as an electrode. In addition, the electrode layer 150 and metallic materials thereon may serve as an electrode.

The adhesion layer 160 is formed on the electrode layer 150. The adhesion layer 160 includes barrier metal or bonding metal. For example, the adhesion layer 160 may include at least one selected from the group consisting of Ti, Au, Sn, Ni, Cr, Ga, In, Bi, Cu, Ag and Ta, but the embodiment is not limited thereto.

The adhesion layer 160 may serve as a bonding layer, and the top surface of the adhesion layer 160 is bonded with the conductive support member 170. The conductive support member 170 serves as a base substrate. The conductive support member 170 may include Cu, Au, Ni, Mo, Cu—W, or a carrier wafer such as Si, Ge, GaAs, ZnO, SiC, SiGe, or GaN. The conductive support member 170 may be bonded with the adhesion layer 160, formed as a coating layer of the adhesion layer 160, or attached to the adhesion layer 160 in the form of a conductive sheet. According to the embodiment, the adhesion layer 160 may not be formed. In this case, the conductive support member 170 may be formed on the electrode layer 150.

Figure 8:
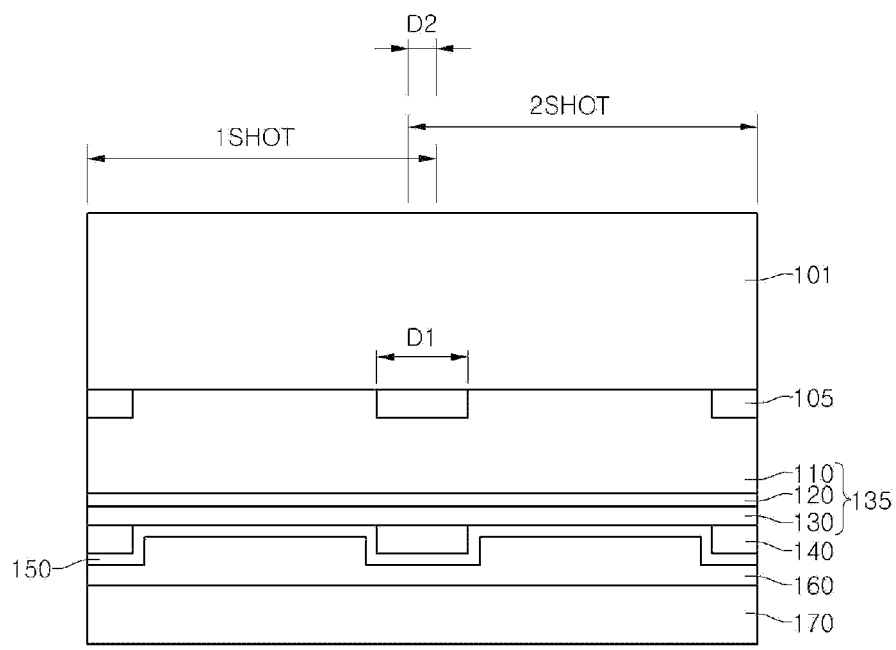
Figure 9:
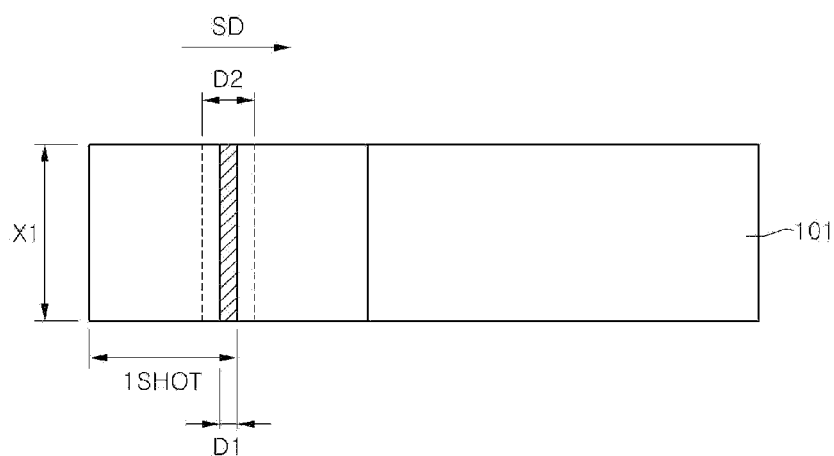
Figure 10:
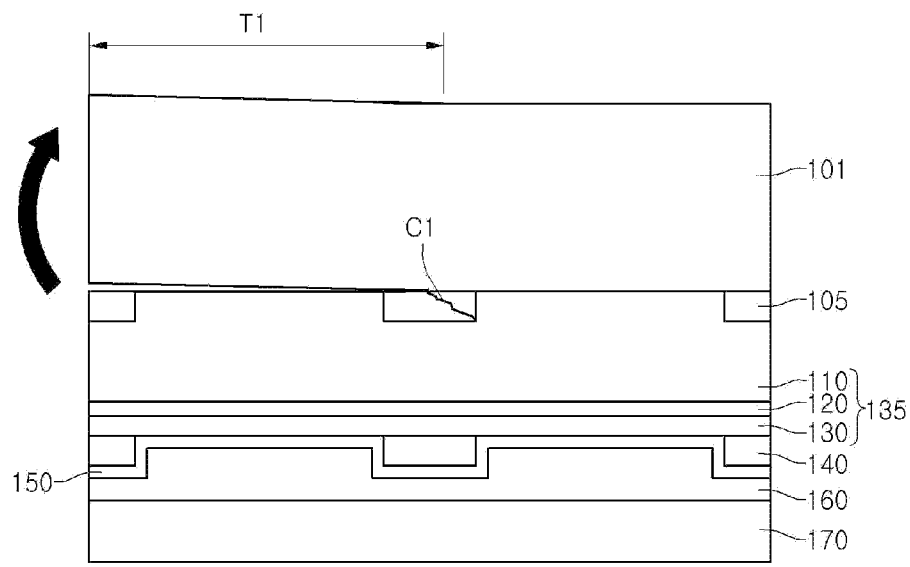

Referring to FIGS. 8 to 10, the conductive support member 170 is placed on the base substrate, and the substrate 101 is provided on the light emitting structure 135. Therefore, the substrate 101 is removed.

The substrate 101 may be removed through a laser lift off (LLO) process. According to the LLO process, a laser beam having a predetermined wavelength band (e.g., 248 nm, 193 nm) is irradiated into the substrate 101 to separate the substrate 101. The laser beam having the wavelength passes through the substrate 101 having a band gap higher than laser energy, and is absorbed into a layer (e.g., the absorption layer 105) and the first conductive type semiconductor layer 110 having a band gap lower than the laser energy. In this case, the substrate 101 can be separated from the absorption layer 105 and the first conductive type semiconductor layer 110 because the interfacial surface of the substrate 101 is removed relative to the absorption layer 105 and the first conductive type semiconductor layer 110.

Referring to FIGS. 8 and 9, laser shots are given onto the substrate 101. The laser shots are sequentially given in a scan direction SD in the unit of one shot. In this case, one side x1 of one shot may have various lengths, but the embodiment is not limited thereto. Adjacent laser shots overlap with each other on the absorption layer 105. An overlap region D2 has a width of about 5 μm to 10 μm. The overlap region D2 may have a width narrower than or equal to that of the absorption layer 105. The overlap region D2 may be arranged in the absorption layer 105 (e.g., a thickness of about 10 μm to 30 μm).

The absorption layer 105 is provided corresponding to the overlap region D2 of the laser shots to absorb a laser beam in the overlap region of edges of the laser shots, so that the semiconductor layers 110, 120, and 130 can be prevented from being damaged.

As shown in FIG. 10, as the laser beam is sequentially irradiated onto the substrate 101, the regions of the substrate 101 receiving the laser beam are sequentially separated. The portion of the substrate 101 onto which the laser beam has been irradiated is separated, and a portion of the absorption layer 105 onto which the laser beam is not irradiated has a crack C1 due to the separation of the substrate 101. The crack C1 exists in the absorption layer 105, and is not delivered to another semiconductor layer. Accordingly, when the substrate 101 is separated, a crack can be prevented from occurring on the surface of the first conductive type semiconductor layer 110.

Figure 11:
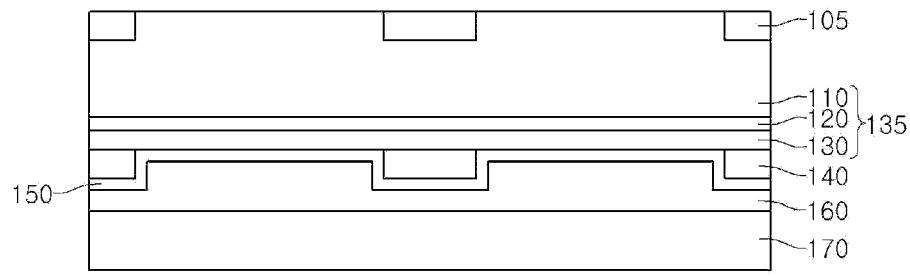

As shown in FIG. 11, if the substrate 101 is removed, the top surface of the first conductive type semiconductor layer 110 and the absorption layer 105 is exposed.

Figure 12:
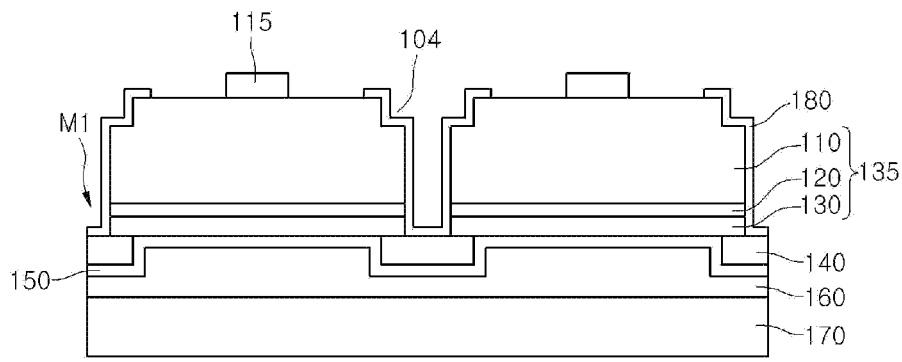
Figure 13:
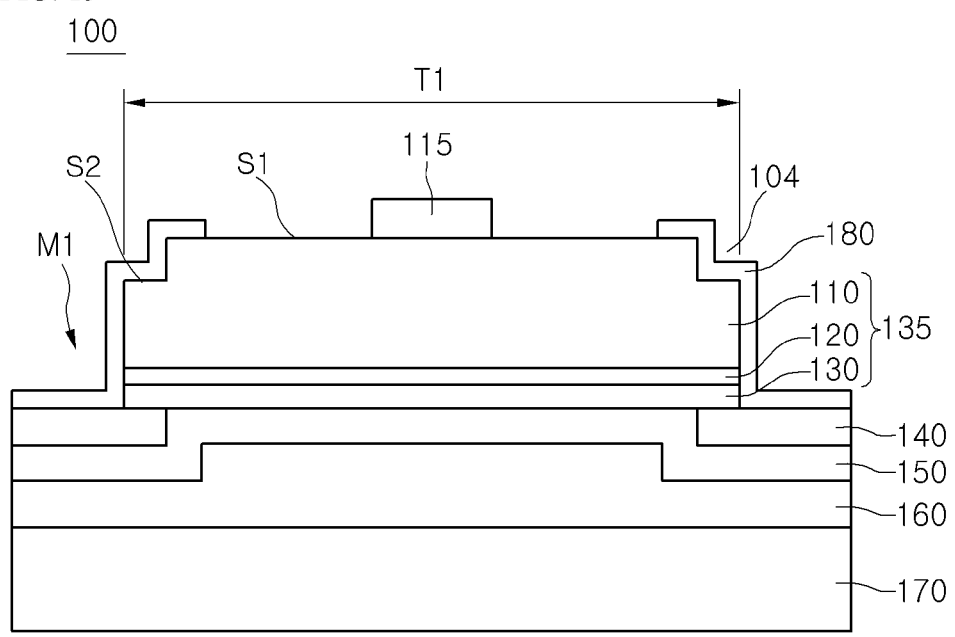

Referring to FIGS. 11 to 13, the light emitting structure 135 of the channel region M1, which is a boundary region between chips, is removed through an isolation etching process. In other words, the isolation etching process is performed with respect to the boundary region between chips, so that a portion of the protective layer 140 is exposed in the channel region M1, and the lateral surface of the light emitting structure 135 may be inclined or vertically formed due to the isolation etching process.

A portion or an entire portion of the absorption layer 105 may be removed, and the absorption layer 105 becomes the stepped structure 104. The portion or the entire portion of the stepped structure 104 may be removed through a wet etching process. The process of removing the absorption layer 105 may be performed before or after the isolation etching process is performed. The wet etching process may be performed by using etchant selectively including $HNO_3$, $CH_3COOH$, $H_3PO_4$, or $H_2SO_4$, but the embodiment is not limited thereto.

Through the isolation etching process, an upper portion of the stepped structure 104 may be open, or the step region 104 may have the shape of continuous grooves formed along the edge of the first conductive type semiconductor layer 110.

The protective layer 140 transmits the laser beam to prevent lower metal materials such as the electrode layer 150, the adhesion layer 160, and the conductive support member 170 from protruding in the irradiation direction of the laser beam or from being broken. In addition, the protective layer 140 may protect the outer wall of each layer of the light emitting structure 135.

An etching process is performed with respect to the first top surface S1 of the first conductive type semiconductor layer 110 such that roughness or a pattern may be formed on the top surface. The roughness or the pattern may improve light extraction efficiency. The insulating layer 180 may be formed around the light emitting structure 135. The insulating layer 180 may be formed on the first top surface S1 of the first conductive type semiconductor layer 110 and at the lateral surface of the layers 110, 120, and 130 of the light emitting structure 135. In addition, the insulating layer 180 may extend to the top surface of the protective layer 140. The insulating layer 180 may include a material, such as $SiO_2$, $SiO_x$, $SiO_xN_y$, $Si_3N_4$, $Al_2O_3$, or $TiO_2$, having a refractive index lower than the refractive index (GaN: about 2.4) of the compound semiconductor. The insulating layer 180 and the protective layer 140 may prevent moisture from being permeated into the chip.

The second top surface S2 lower than the first top surface S1 is provided in the stepped structure 104 of the first conductive type semiconductor layer 110, and the insulating layer 180 is formed in a stepped shape at the stepped structure 104 including the second top surface S2. The stepped structure 104 may improve light extraction efficiency or light orientation distribution.

The electrode 115 may be formed on the first conductive type semiconductor layer 110 or at another region of the first conductive type semiconductor layer 110, and may be electrically connected to the first conductive type semiconductor layer 110. The electrode 115 may include a branch-type pattern and pad having a predetermined shape.

An individual chip unit is formed based on a chip boundary. The individual chip unit may be formed through a cutting process, or a laser or breaking process, but the embodiment is not limited thereto. The inner part of the top surface of the protective layer 140 makes contact with the outer portion of the lower surface of the second conductive type semiconductor layer 130.

When the top surface of the first conductive type semiconductor layer 110 is subject to polishing or lapping, the stepped structure 104 may be removed, and the material of the absorption layer 105 may exist.

Figure 14:
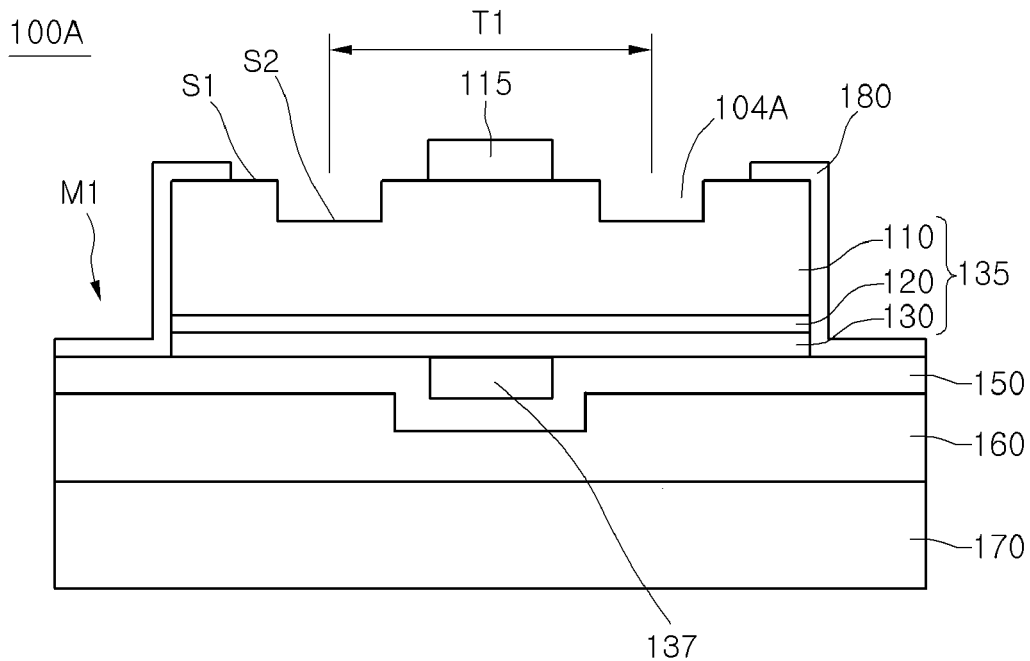
FIG. 14 is a side sectional view showing a light emitting device according to a second embodiment.

FIG. 14 is a side sectional view showing a light emitting device 100A according to a second embodiment. Hereinafter, the second embodiment will be described while focusing on the difference from the first embodiment in order to redundancy.

Referring to FIG. 14, the light emitting device 100A includes a stepped structure 104A having a loop shape formed on the first conductive type semiconductor layer 110. The stepped structure 104A having the loop shape is formed by the second top surface S2 lower than the first top surface S1 within the first top surface S1. The stepped structure 104A may have a recess shape or a concave shape with an open top surface. The stepped structure 104A has a first recess portion between a first lateral surface of the first conductive type semiconductor layer 110 and the electrode 115, a second recess portion between a second lateral surface of the first conductive type semiconductor layer 110 and the electrode 115, and plurality of third recess portions connected to the first recess portion and the second recess portion.

The stepped structure 104A is provided inside an upper portion of the first conductive type semiconductor layer 110, and the interval between the stepped structures 104A may be an interval between two shots of the laser beam. For example, the interval between the stepped structures 104A is a distance from the first recess portion to the second recess portion of the stepped structure 104A. The interval between the two shots of the laser beam may be determined differently from the channel region M1, which is subject to the isolation etching, according to a chip size. For example, if a chip having a large area is required, the stepped structure 104A corresponding to the interval between two shots of the laser beam may be aligned inward as compared with a chip edge.

The insulating layer 180 may be provided around the light emitting structure 135. The insulating layer 180 may prevent moisture from being permeated from the outside of the light emitting structure 135. The stepped structure 104A may not be covered by the insulating layer 180.

The electrode layer 150 may extend outwardly from a lower portion of the light emitting structure 135, and the insulating layer 180 may extend to the top surface of the electrode layer 150 in the channel region.

A current blocking layer 137 may be formed between the electrode layer 150 and the second conductive type semiconductor layer 130, and the current blocking layer 137 may overlap with the electrode 115 in a thickness direction of the light emitting structure 135. The current blocking layer 137 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, and $TiO_2$. When the electrode layer 150 includes Ag, the current blocking layer 137 may include ITO, ZnO, or $SiO_2$. A single-layer pattern, a multiple-layer pattern, or a layer, which includes one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_2$, Ag, Ni, Al, Rh, Pd, Ir, Ru, Mg, Zn, Pt, Au, Hf, and selective combination thereof, may be interposed between the electrode layer 150 and the second conductive type semiconductor layer 130, but the embodiment is not limited thereto.

Figure 15:
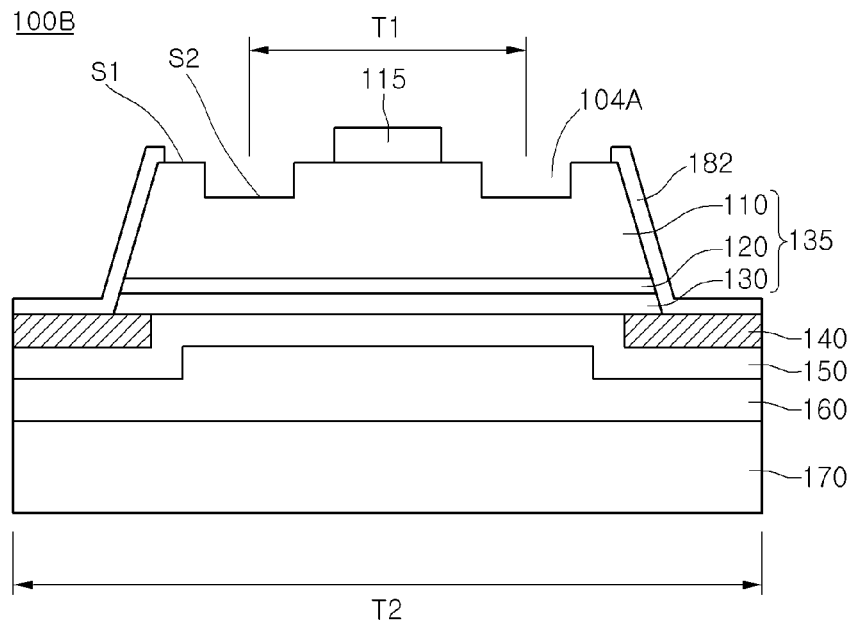
FIG. 15 is a side sectional view showing a light emitting device according to a third embodiment.

FIG. 15 is a side sectional view showing a light emitting device 100B according to a third embodiment. The third embodiment will be described while focusing on the difference between the third embodiment and the first and second embodiments in order to avoid redundancy.

Referring to FIG. 15, in the light emitting device 100B, an interval T2 between the protective layers 140 is different from an interval T1 of the stepped structures 104A.

The protective layer 140 may be provided in the form of a close loop between the second conductive type semiconductor layer 130 and the electrode layer 150, and may be provided in a single layer structure or a multiple layer structure. The interval T2 between the outer sides of the protective layer 140 may serve as one chip interval.

The stepped structure 104A having a height lower than that of the first top surface S1 is formed inside the first top surface S1 of the first conductive type semiconductor layer 110. The interval T1 between the stepped structures 104A may be less than the interval T2 between the protective layers 140.

The interval T2 of the protective layer 140 is formed through an isolation etching process, and the interval T1 of the stepped structures 104A is formed through a laser lift process. Accordingly, when the interval T2 of the protective layers 140 is greater than the interval T1 of the stepped structures 104A according to a chip size, the step regions 104A may be provided inward from the edge of the first conductive type semiconductor layer 110.

The insulating layer 182 is formed around the light emitting structure 135. One side of the insulating layer 182 is formed on the protective layer 140, and an opposite side of the insulating layer 180 extends to the first top surface S1 of the first conductive type semiconductor layer 110. The protective layer 140 may be provided on a top surface and/or a lower surface thereof with a roughness or a pattern, but the embodiment is not limited thereto.

Figure 16:
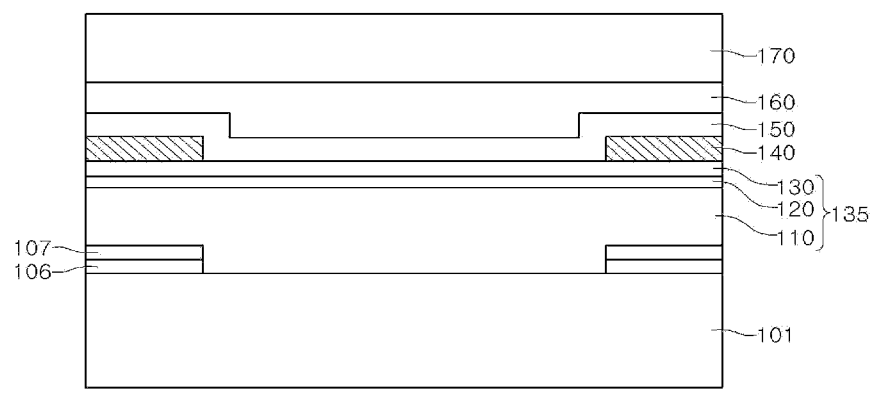
FIGS. 16 and 17 are sectional views showing a method of manufacturing a light emitting device according to a fourth embodiment.
Figure 17:
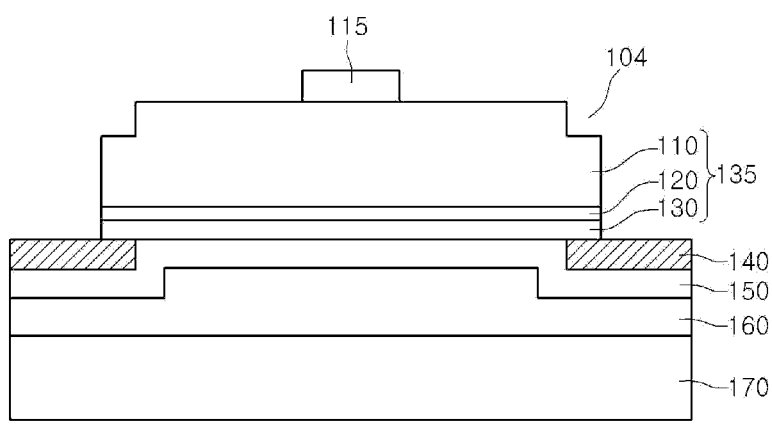

FIGS. 16 and 17 are side sectional views showing a method of manufacturing a light emitting device according to a fourth embodiment. Hereinafter, the fourth embodiment will be described while focusing on a difference between the above embodiments and the fourth embodiment in order to avoid redundancy.

Referring to FIGS. 16 and 17, an absorption layer 106 is formed on the substrate 101, and a capping layer 107 is formed on the absorption layer 106. The absorption layer 106 may include a metallic oxide, such as ZnO, WO, or MoO, having a band gap lower than that of a nitride semiconductor or the substrate 101.

The capping layer 107 may include $Al_2O_3$, AlN, TiN, or CrN. The capping layer 107 covers a top surface of the absorption layer 106, and serves as a buffer used to grow a compound semiconductor.

The capping layer 107 may include a material, such as $Al_2O_3$ or AlN, having a lattice constant difference less than that of the absorption layer 106, or a material, such as TiN or CrN, capable of improving an adhesive strength with a compound semiconductor.

The absorption layer 106 absorbs a laser beam irradiated in an LLO process to separate the substrate 101. The capping layer 107 may solve a problem in which a compound semiconductor is not grown sufficiently due to the material of the absorbing layer 106. According to the embodiment, although a stack structure of the absorption layer 106 and the capping layer 107 has been suggested, a transmissive layer may be provided under the absorption layer 106 or the capping layer 107. The transmissive layer may include one selected from the group consisting of $SiO_2$ and $Al_2O_3$, or one selected from the group consisting of ITO, IZO, IZTO, IAZO, IGZO, IGTO, AZO, and ATO. The capping layer 107 and/or the transmissive layer can reduce the damage caused when the substrate 101 is separated.

After the substrate 101 has been subject to the LLO process, the substrate 101 is removed, and the absorption layer 106 and the capping layer 107 are removed through a wet etching process. An isolation etching process and a chip separating process are performed to manufacture a device shown in FIG. 17. In this case, the capping layer 107 and/or the absorption layer 106 may exist in the step region 104 of the first conductive type semiconductor layer 110 of the final semiconductor device, but the embodiment is not limited thereto.

Figure 18:
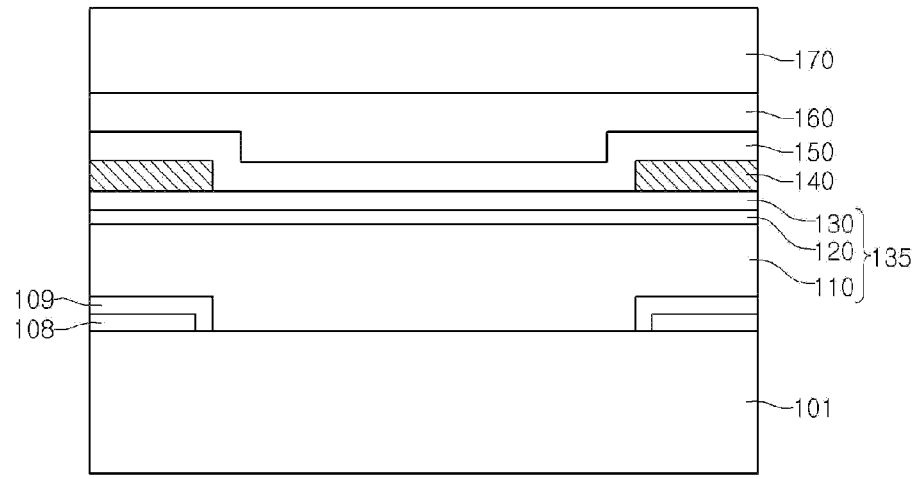
FIGS. 18 and 19 are a sectional view showing a method of manufacturing of a light emitting device according to a fifth embodiment.
Figure 19:
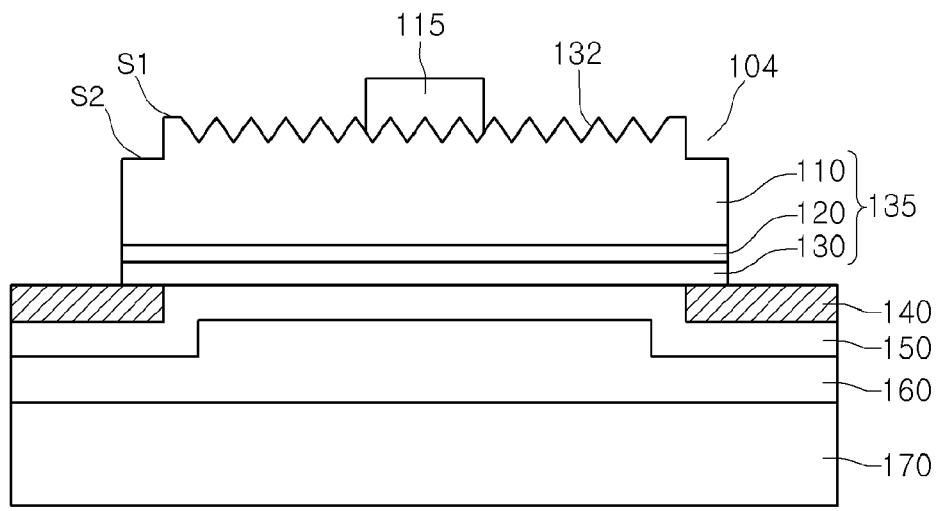

FIGS. 18 and 19 are side sectional views showing a method of manufacturing a light emitting device according to a fifth embodiment. Hereinafter, the fifth embodiment will be described while focusing on the difference between the above embodiments and the fifth embodiment in order to avoid redundancy.

Referring to FIGS. 18 and 19, absorption layers 108 are formed on the substrate 101 at a laser shot interval, and a capping layer 109 is provided to cover an internal lateral surface an a top surface of the absorption layer 108. The absorption layer 108 may be provided on the substrate 101 or on the transmissive layer, and the capping layer 109 may be provided at the lateral surface and the top surface of the absorption layer 108 to surround the absorption layer 108.

In an individual chip, the absorption layer 108 and the capping layer 109 may be provided on edges of the first conductive type semiconductor layer 110 or provided inward from the edges of the first conductive type semiconductor layer 110, but the embodiment is not limited thereto.

After the substrate 101 has been subject to the LLO process, the substrate 101 is removed, and the absorption layer 108 and the capping layer 109 are removed through a wet etching process. An isolation etching process and a chip separating process are performed to manufacture a device shown in FIG. 19. In this case, the capping layer 109 and/or the absorption layer 108 may exist in the step region 104 of the first conductive type semiconductor layer 110 of the final semiconductor device, but the embodiment is not limited thereto.

A roughness or a pattern 132 may be formed on the first top surface S1 of the first conductive type semiconductor layer 110, or a flat surface may be formed under the electrode 115, but the embodiment is not limited thereto.

Figure 20:
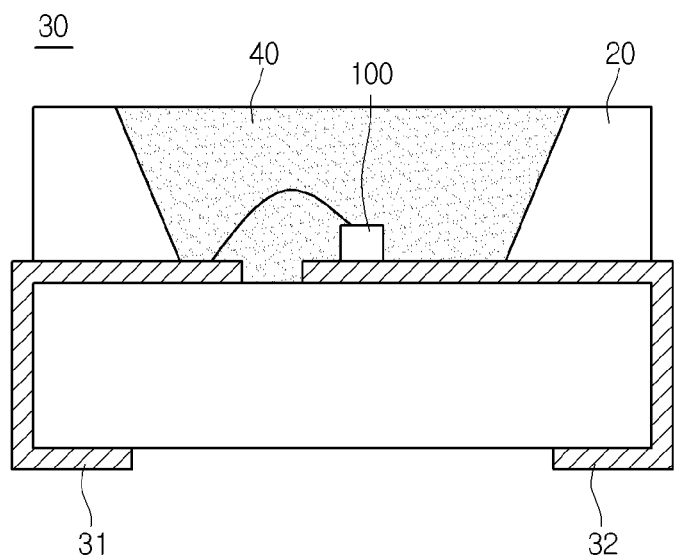
FIG. 20 is a side sectional view showing a light emitting device package according to an embodiment.

FIG. 20 is a sectional view showing a light emitting device package 30 according to a tenth embodiment.

Referring to FIG. 20, the light emitting device package 30 according to the embodiment includes a body 10, first and second lead electrode layers 31 and 32 formed on the body 10, the light emitting device 100 provided on the body 10 and electrically connected to the first and second electrode layers 31 and 32 and a molding member 40 that surrounds the light emitting device 100.

The body 20 may include a conductive substrate including silicon, synthetic resin including PPA, a ceramic substrate, an insulating substrate, or a metallic substrate (e.g., MCPCB). An inclined surface may be formed around the light emitting device 100. The body 20 may include a through hole structure, but the embodiment is not limited thereto.

The first and second lead electrodes 31 and 32 are electrically insulated from each other and supply power to the light emitting device 100. The first and second lead electrodes 31 and 32 may reflect light emitted from the light emitting device 100 to increase light efficiency, and may discharge heat emitted from the light emitting device 100 to the outside.

The light emitting device 100 may be mounted on the body 20 or on the first and second lead electrodes 31 and 32.

The light emitting device 100 may be electrically connected with the first lead electrode 31 through a wire, and may be connected with the second lead electrode 32 through a die bonding scheme.

The molding member 40 may protect the light emitting device 100 while surrounding the light emitting device 100. In addition, the molding member 40 may include phosphors to change the wavelength of light emitted from the light emitting device 100. A lens may be provided on the molding member 40, and the lens may be realized in a contact structure or a non-contact structure with the molding member 40.

The light emitting device 100 may be electrically connected with the body 20 or a lower surface of a substrate via a through hole.

At least one of the above light emitting devices according to the embodiments may be mounted is the light emitting package, but the embodiment is not limited thereto.

Although the embodiment has been described in that the light emitting device package has a top view type, the light emitting device package may have a side view type. Accordingly, a heat sink characteristic, conductivity, and a reflectance characteristic can be improved. After such a top-view-type or side-view-type light emitting device is packaged in the resin layer, a lens may be formed on the resin layer or the lens may be bonded with the resin layer, but the embodiment is not limited thereto.

<Lighting System>

The light emitting devices and the light emitting device packages according to the embodiments may be applied to a light unit. The light unit may have an array structure including a plurality of light emitting devices or a plurality of light emitting device packages. The lighting system may include a display apparatus shown in FIGS. 21 and 22, a light unit shown in FIG. 23, in addition to a lighting lamp, a signal light, a vehicle headlight, an electronic display, etc.

Figure 21:
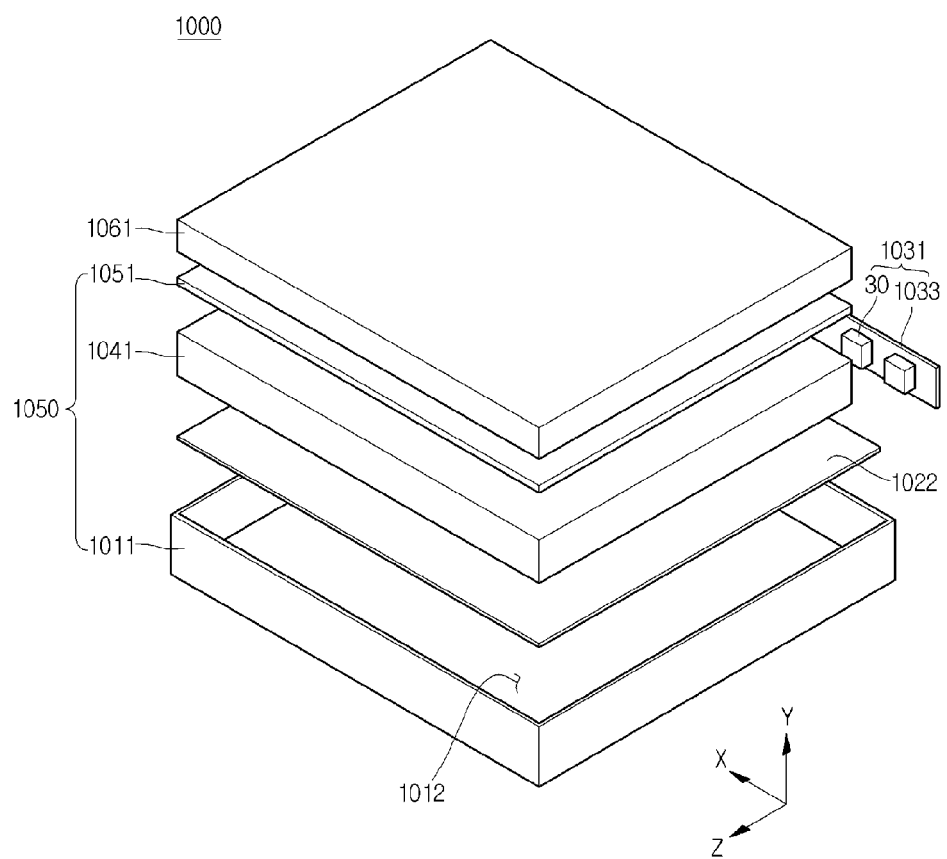
FIG. 21 is a disassembled perspective view of a display apparatus provided with the light emitting device package of FIG. 20.

FIG. 21 is a disassembled perspective view of a display apparatus according to an embodiment.

Referring to FIG. 21, the display apparatus 1000 according to the embodiment may include a light guide panel 1041, a light emitting module 1031 supplying light to the light guide panel 1041, a reflective member 1022 under the light guide panel 1041, an optical sheet 1051 on the light guide panel 1041, a display panel 1061 on the optical sheet 1051, and a bottom cover 1011 receiving the light guide panel 1041, the light emitting module 1031, and the reflective member 1022, but the present disclosure is not limited thereto.

The bottom cover 1011, the reflective sheet 1022, the light guide panel 1041, and the optical sheet may be defined as a light unit 1041.

The light guide panel 1041 functions to transform linear light to planar light by diffusing the linear light. The light guide panel 1041 may be made of a transparent material, and may include one of acryl-series resin such as polymethyl metaacrylate (PMMA), polyethylene terephthlate (PET), poly carbonate (PC), COC, and polyethylene naphthalate resin.

The light emitting module 1031 provides light to at least a side surface of the light guide panel 1041, and finally acts as a light source of a display apparatus.

The light emitting module 1031 may include at least one light emitting module, and provide light directly or indirectly from one side surface of the light guide panel 1041. The light emitting module 1031 may include a board 1033, and a light emitting device package 30 according to embodiments disclosed above, and the light emitting device packages 30 may be arranged apart by a predetermined interval from each other on the board 1033.

The board 1033 may be a printed circuit board (PCB) including a circuit pattern (not shown). The board 1033 may include a metal core PCB (MCPCB), a flexible PCB (FPCB), etc. as well as the general PCB, but the present disclosure is not limited thereto. In the case where the light emitting device package 30 is mounted on a side surface or a heat releasing plate, the board 1033 may be removed. Herein, some of the heat releasing plate may contact an upper surface of the bottom cover 1011.

The plurality of light emitting device packages 30 may be mounted on the board 1033 such that light emitting surfaces of the plurality of light emitting device packages 30 are spaced apart by a predetermined distance from the light guide panel 1041, but the present disclosure is not limited thereto. The light emitting device package 30 may supply light to a light incident part that is one side surface of the light guide panel 1041, directly or indirectly, but the present disclosure is not limited thereto.

The reflective member 1022 may be provided under the light guide panel 1041. The reflective member 1022 reflects light incident from a lower surface of the light guide panel 1041 to allow the reflected light to be directed toward an upper direction, thereby capable of enhancing brightness of the light unit 1050. The reflective member 1022 may be formed of, for example, PET, PC, PVC resin, or the like, but the present disclosure is not limited thereto.

The bottom cover 1011 may receive the light guide panel 1041, the light emitting module 1031, the reflective member 1022, and the like. For this purpose, the bottom cover 1011 may have a receiving part 1012 formed in a box shape a top surface of which is opened, but the present disclosure is not limited thereto. The bottom cover 1011 may be coupled to a top cover, but the present disclosure is not limited thereto.

The bottom cover 1011 may be formed of a metal material or resin material, and may be manufactured by using a process such as a press molding or an injection molding. Also, the bottom cover 1011 may include metallic or nonmetallic material having a high thermal conductivity, but the present disclosure is not limited thereto.

The display panel 1061 is, for example, an LCD panel, and includes first and second transparent substrates facing each other, and a liquid crystal layer interposed between the first and second substrates. A polarizing plate may be attached on at least one surface of the display panel 1061, but the present disclosure is not limited thereto. The display panel 1061 displays information by using light passing through the optical sheet 1051. The display apparatus 1000 may be applied to a variety of mobile terminals, monitors for notebook computers, monitors for lap-top computers, televisions, etc.

The optical sheet 1051 is disposed between the display panel 1061 and the light guide panel 1041, and includes at least one transparent sheet. The optical sheet 1051 may include, for example, at least one of a diffusion sheet, a horizontal and/or vertical prism sheet, and a brightness reinforcing sheet. The diffusion sheet diffuses incident light, the horizontal and/or vertical prism sheet focuses incident light on a display region, and the brightness reinforcing sheet enhances the brightness by reusing lost light. Also, a protective sheet may be disposed on the display panel 1061, but the present disclosure is not limited thereto. Herein, the display apparatus 1000 may include the light guide panel 1041, and the optical sheet 1051 as optical members positioned on a light path of the light emitting module 1031, but the present disclosure is not limited thereto.

Figure 22:
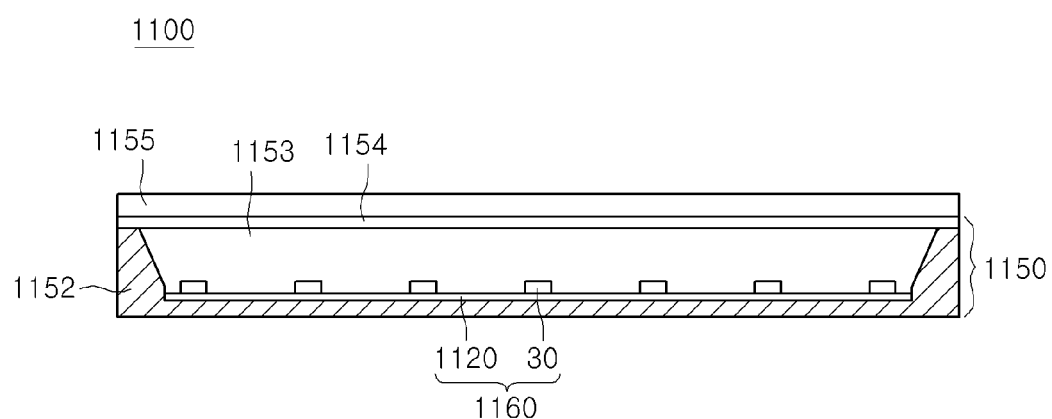
FIG. 22 is a schematic sectional view illustrating another example of a display apparatus provided with the light emitting device package of FIG. 20.

FIG. 22 is a cross-sectional view of a display apparatus according to an embodiment.

Referring to FIG. 22, the display apparatus 1100 includes a bottom cover 1152, a board 1120 on which the light emitting device packages 30 disclosed above are arrayed, an optical member 1154, and a display panel 1155.

The board 1120 and the light emitting device package 30 may be defined as a light emitting module 1060. The bottom cover 1152, the at least one light emitting module 1060, and the optical member 154 may be defined as a light unit.

The bottom cover 1152 may be provided with a receiving part, but the present disclosure is not limited thereto.

Herein, the optical member 1154 may include at least one of a lens, a light guide panel, a diffusion sheet, a horizontal and vertical prism sheet, and a brightness reinforcing sheet. The light guide panel may be formed of polycarbonate (PC) or poly methyl methacrylate (PMMA), and may be removed. The diffusion sheet diffuses incident light, the horizontal and vertical prism sheet focuses incident light on a display region, and the brightness reinforcing sheet enhances the brightness by reusing lost light.

The optical member 1154 is disposed on the light emitting module 1060. The optical member 154 transforms light emitted from the light emitting module 1060 to planar light, and performs diffusion, light focusing, and the like.

Figure 23:
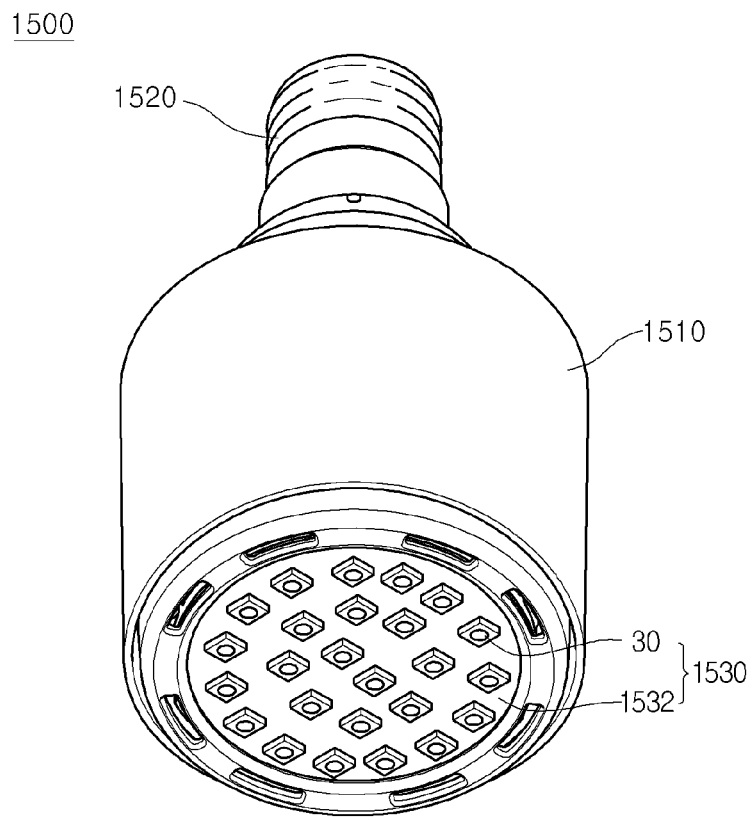
FIG. 23 is a perspective view of a lighting apparatus provided with the light emitting device package of FIG. 20.

FIG. 23 is a perspective view of a lighting unit according to an embodiment.

Referring to FIG. 23, the lighting unit 1500 may include a case 1510, a light emitting module 1530 equipped in the case 1510, and a connection terminal 1520 equipped in the case 1510 and supplied with an electric power from an external power supply.

The case 1510 may be preferably formed of a material having good heat shielding characteristics, for example, a metal material or a resin material.

The light emitting module 1530 may include a board 1532, and at least one light emitting device package 30 according to the embodiments mounted on the board 1532. The light emitting device package 30 may include a plurality of light emitting device packages which are arrayed apart by a predetermined distance from one another in a matrix configuration.

The board 1532 may be an insulator substrate on which a circuit pattern is printed, and may include, for example, a printed circuit board (PCB), a metal core PCB, a flexible PCB, a ceramic PCB, an FR-4 substrate, etc.

Also, the board 1532 may be formed of a material to efficiently reflect light, and a surface thereof may be formed in a color capable of efficiently reflecting light, for example, white color, or silver color.

The at least one light emitting device packages 30 may be mounted on the board 1532. Each of the light emitting device packages 30 may include at least one light emitting diode (LED) chip. The LED chip may include a color LED emitting red, green, blue or white light, and a UV LED emitting ultraviolet (UV).

The light emitting module 1530 may have a combination of various light emitting device packages so as to obtain desired color and luminance. For example, the light emitting module 1530 may have a combination of a white LED, a red LED, and a green LED so as to obtain a high color rendering index (CRI).

The connection terminal 1520 may be electrically connected to the light emitting module 1530 to supply power. The connection terminal 1520 may be screwed and coupled to an external power in a socket type, but the present disclosure is not limited thereto. For example, the connection terminal 1520 may be made in a pin type and inserted into an external power, or may be connected to the external power through a power line.

According to the embodiment, as described above, after the light emitting device 100 has been packaged, the package may be provided on the substrate to realize a light emitting module. According to the embodiment, after the light emitting device shown in FIG. 1 has been provided on the substrate 101, the light emitting device may be packaged to realize the light emitting module.

The method of manufacturing the light emitting device according to the embodiment includes a step of forming an absorption layer formed on a substrate, including a material having a band gap lower than a band gap of the substrate, and having a loop shape having a first interval; a step of forming a plurality of compound semiconductor layers including a first conductive type semiconductor layer, an active layer, and a second conductive type semiconductor layer; a step of forming a transmissive protective layer at an outer peripheral portion of the compound semiconductor layers; a step of forming an electrode layer on the compound semiconductor layers; a step of irradiating a laser beam onto the substrate at a laser shot size of the first interval to separate the substrate; a step of removing the absorption layer; and a step of forming a first electrode electrically connected with the first conductive type semiconductor layer.

According to the embodiment, the damage of the semiconductor layer according to the removal of the substrate can be prevented, and the reliability for the light emitting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure including a first conductive semiconductor layer, a second conductive semiconductor layer under a bottom surface of the first conductive semiconductor layer, and an active layer between the bottom surface of the first conductive semiconductor layer and a top surface of the second conductive semiconductor layer;
    an insulating layer disposed on a lateral surface of the light emitting structure;
    an electrode on the first conductive semiconductor layer;
    an electrode layer under a bottom surface of the second conductive semiconductor layer;
    a conductive support member under the electrode layer; and
    a protective layer including a first portion between the light emitting structure and the electrode layer and a second portion extending outward beyond a bottom surface of the light emitting structure,
    wherein the first conductive semiconductor layer includes a first top surface and a second top surface located at lower position than that of the first top surface,
    wherein the second top surface of the first conductive semiconductor layer is closer to an edge region of the first conductive semiconductor layer than a center region of the first conductive semiconductor layer,
    wherein the second top surface of the first conductive semiconductor layer is vertically overlapped with the first portion of the protective layer in a vertical direction,
    wherein an entire region of the protective layer is located at a lower position than that of the bottom surface of the second conductive semiconductor layer.

2. The light emitting device of claim 1, wherein the insulating layer is disposed on the second top surface of the first conductive semiconductor layer.

3. The light emitting device of claim 2, wherein the insulating layer includes a first portion extended to the first top surface of the first conductive semiconductor layer and a second portion extended to the second portion of the protective layer.

4. The light emitting device of claim 3, wherein the first conductive semiconductor layer has a first thickness thicker than a second thickness,
    wherein the first thickness is a distance of the first top surface and the bottom surface of the first conductive semiconductor layer,
    wherein the second thickness is a distance of the second top surface and the bottom surface of the second conductive semiconductor layer.

5. The light emitting device of claim 3, wherein the first top surface of the first conductive semiconductor layer includes a roughness.

6. The light emitting device of claim 5, wherein the electrode contacts the first top surface of the first conductive semiconductor layer.

7. The light emitting device of claim 1, wherein the second top surface has a depth of 100 Å to 30000 Å from the first top surface of the first conductive semiconductor layer.

8. The light emitting device of claim 1, wherein the second top surface is formed in a stepped structure from the first top surface.

9. The light emitting device of claim 8, wherein the second top surface surrounds the first top surface of the first conductive semiconductor layer.

10. The light emitting device of claim 2, wherein the second top surface includes a flat surface.

11. The light emitting device of claim 1, wherein the protective layer includes an insulation material.

12. The light emitting device of claim 1, wherein the electrode layer has a width wider than that of the top surface of the first conducive semiconductor layer.

13. The light emitting device of claim 1, further comprising a current blocking layer is disposed on a region of between the electrode layer and the bottom surface of the second conductive semiconductor layer,
    wherein the current blocking layer is vertically overlapped with the electrode,
    wherein the current blocking layer includes an insulating material.

14. The light emitting device of claim 1, wherein the first conductive semiconductor layer has a thickness thicker than that of the second semiconductor layer.

15. A light emitting device comprising:
    a light emitting structure including a first conductive semiconductor layer, a second conductive semiconductor layer under a bottom surface of the first conductive semiconductor layer, and an active layer between the bottom surface of the first conductive semiconductor layer and a top surface of the second conductive semiconductor layer;
    an insulating layer disposed on a lateral surface of the light emitting structure;
    an electrode on the first conductive semiconductor layer;
    an electrode layer under a bottom surface of the second conductive semiconductor layer;

a conductive support member under the electrode layer; and a protective layer including a first portion between the light emitting structure and the electrode layer and a second portion extending outward beyond a bottom surface of the light emitting structure, wherein the first conductive semiconductor layer includes a first top surface and a second top surface located at lower position than that of the first top surface, wherein the second top surface of the first conductive semiconductor layer is closer to an edge region of the first conductive semiconductor layer than a center region of the first conductive semiconductor layer, wherein the second top surface of the first conductive semiconductor layer is vertically overlapped with the first portion of the protective layer in a vertical direction, wherein the first top surface of the first conductive semiconductor layer has an area greater than that of the second top surface of the first conductive semiconductor layer, wherein an entire region of the protective layer is located at a lower position than that of the bottom surface of the second conductive semiconductor layer.

16. The light emitting device of claim 15, wherein the electrode layer includes a reflective layer and an adhesion layer between the reflective layer and the conductive support member, wherein a portion of the electrode layer is disposed under the second portion of the protective layer.

17. The light emitting device of claim 16, wherein the conductive support member has a width wider than that of the top surface of the first conducive semiconductor layer, wherein the second top surface of the first conductive semiconductor layer is vertically overlapped with the conductive support member.

18. The light emitting device of claim 17, wherein the conductive support member includes a metal material.

19. The light emitting device of claim 18, wherein the first conductive semiconductor layer include an n-type dopant and has a thickness thicker than that of the second conductive semiconductor layer.

20. A light emitting device comprising:

a light emitting structure including a first conductive semiconductor layer, a second conductive semiconductor layer under a bottom surface of the first conductive semiconductor layer, and an active layer between the bottom surface of the first conductive semiconductor layer and a top surface of the second conductive semiconductor layer;

an insulating layer disposed on a lateral surface of the light emitting structure;

an electrode on the first conductive semiconductor layer;

an electrode layer under a bottom surface of the second conductive semiconductor layer;

a conductive support member under the electrode layer; and a protective layer including a first portion between the light emitting structure and the electrode layer and a second portion extending outward beyond a bottom surface of the light emitting structure, wherein the first conductive semiconductor layer includes a first top surface and a second top surface located at lower position than that of the first top surface, wherein the second top surface of the first conductive semiconductor layer is closer to an edge region of the first conductive semiconductor layer than a center region of the first conductive semiconductor layer, wherein the second top surface of the first conductive semiconductor layer is vertically overlapped with the first portion of the protective layer in a vertical direction, wherein the second portion of the protective layer contacts the insulating layer and the electrode layer, wherein an entire region of the protective layer is located at a lower position than that of the bottom surface of the second conductive semiconductor layer.

* * * * *